(12) United States Patent
Nakatani

(10) Patent No.: US 6,188,099 B1
(45) Date of Patent: *Feb. 13, 2001

(54) STORAGE CAPACITOR STRUCTURE

(75) Inventor: Yasuo Nakatani, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/856,482

(22) Filed: May 14, 1997

(30) Foreign Application Priority Data

Dec. 24, 1996 (JP) .................................... 8-343351

(51) Int. Cl.$^7$ ................................. H01L 27/108

(52) U.S. Cl. .................... 257/308; 257/306; 257/311; 438/253

(58) Field of Search ......................... 257/306, 309, 257/311, 308; 438/253, 396

(56) References Cited

U.S. PATENT DOCUMENTS

| 5,130,885 |   | 7/1992 | Fazan et al. ................ | 361/313 |
|---|---|---|---|---|
| 5,235,199 | * | 8/1993 | Hamamoto et al. ........... | 257/306 |
| 5,436,477 | * | 7/1995 | Hashizume et al. .......... | 257/310 |
| 5,442,213 |   | 8/1995 | Okudaira et al. ............ | 257/310 |
| 5,444,653 |   | 8/1995 | Nagasawa et al. ............ | 365/149 |
| 5,492,850 | * | 2/1996 | Ryou ........................... | 438/253 |
| 5,516,719 | * | 5/1996 | Ryou ........................... | 438/396 |
| 5,532,956 | * | 7/1996 | Watanabe ..................... | 635/149 |
| 5,539,612 |   | 7/1996 | Madan ......................... | 361/303 |
| 5,608,247 | * | 3/1997 | Brown ......................... | 257/306 |
| 5,668,038 | * | 9/1997 | Huang et al. ................ | 438/396 |
| 5,748,521 | * | 5/1998 | Lee ............................. | 365/149 |
| 5,804,853 | * | 9/1998 | Cronin et al. ............... | 257/309 |
| 5,811,331 | * | 9/1998 | Ying et al. .................. | 438/253 |
| 5,926,709 | * | 7/1999 | Aisou et al. ................. | 438/253 |
| 5,940,713 | * | 8/1999 | Green .......................... | 438/396 |

FOREIGN PATENT DOCUMENTS

| 5-55505 | 3/1993 | (JP) . |
|---|---|---|
| 05304267 | 11/1993 | (JP) . |
| 6-21384 | 1/1994 | (JP) . |
| 6-310672 | 11/1994 | (JP) . |
| 7-30077 | 1/1995 | (JP) . |
| 70-74325 | 3/1995 | (JP) . |

OTHER PUBLICATIONS

IEDM, "A Novel Stacked Capacitor Cell With Dual Cell Plate For 64Mb DRAMs", H. Arima et al., pp. 651–654, 1990.

IEEE Journal Of Solid–State Circuits, "256–Mb DRAM Circuit Technologies for File Applications", G. Kitsukawa et al., vol. 28, No. 11, pp. 1105–1111, Nov. 1993.

IEDM, "Spread Source/Drain(SSD) MOSFET Using Selective Silicon Growth for 64Mbit DRAMs", T. Yamada et al., pp. 35–38, 1989.

* cited by examiner

*Primary Examiner*—Mahshid Saadat
*Assistant Examiner*—George C. Eckert, III
(74) *Attorney, Agent, or Firm*—McDermott, Will & Emery

(57) ABSTRACT

A storage node to be a lower electrode of a capacitor is electrically connected to a polysilicon columnar conductive body filling a contact hole with a second polysilicon film therebetween. The second polysilicon film covers the inside of an opening portion formed in the first polysilicon film. The polysilicon film columnar conductive body is electrically connected to a source/drain region of an MOS transistor at a contact. Thus, a semiconductor device with good electrical connection between the capacitor and the transistor may be provided.

9 Claims, 13 Drawing Sheets

STORAGE CAPACITOR STRUCTURE

BACKGROUND OF THE INVENTION

1. Field of the Invention

The present invention relates generally to semiconductor devices and manufacturing methods thereof, and more particularly to a semiconductor device such as Dynamic Random Access Memory (hereinafter referred to as "DRAM") into which a capacitor for accumulating charges as information can be readily formed and a method of manufacturing such a device.

2. Description of the Background Art

In recent years, there is a rapidly increasing demand for semiconductor devices with the remarkable spread of information equipments such as computer devices. From a functional view point, devices having larger storage capacity and capable of high speed operation are in demand. To cope with the demand, technological developments associated with semiconductor devices having higher integration density, faster response and higher reliability have been underway.

Among semiconductor memory devices, the DRAM permits random input/output of storage information. The DRAM generally includes a memory cell array, a storage region for accumulating a plurality of pieces of storage information, and peripheral circuitry necessary for input/output from/to the outside.

FIG. 11 is a block diagram showing the configuration of a general DRAM. Referring to FIG. 11, a DRAM 150 includes a memory cell array 151 for accumulating a data signal representing storage information, a row and column address buffer 152 for receiving an externally applied address signal to select a memory cell forming a unit storage circuit, a row decoder 153 and a column decoder 154 for designating the memory cell by decoding the address signal, a sense refresh amplifier 155 for amplifying and reading a signal accumulated in the designated memory cell, a data in buffer 156 and a data out buffer 157 for input/output of data, and a clock generator 158 for generating a clock signal. Memory cell array 151 occupying a large area on the semiconductor chip has a plurality of memory cells arranged in a matrix each accumulating unit storage information.

FIG. 12 is a diagram showing a circuit equivalent to memory cells for 4 bits in the memory cell array. Referring to FIG. 12, a memory cell includes a bit line 214, an MOS (Metal-Oxide-Semiconductor) transistor 215, a capacitor 216 having one electrode connected to MOS transistor 215, and a word line 217. Information is accumulated in capacitor 216 as charge. Each memory cell shown in FIG. 12 is a so-called one-transistor-one-capacitor type memory cell formed of a single MOS transistor 215 and a single capacitor 216 connected thereto. The memory cell of this type is advantageous in increasing the integration density of the memory cell array for its simple structure, and is widely used in a DRAM which requires a large capacity.

Meanwhile, higher integration densities of semiconductor devices require a higher integration density of a memory cell array which requires a large area in a semiconductor device as well. In order to shrink the memory cell array, a capacitor forming part of a memory cell should be reduced in size as well. Reducing a capacitor in size however reduces the amount of charge as information to be accumulated in the capacitor (the amount of charge accumulated in a 1 bit memory cell).

If the amount of charge to be accumulated in a 1 bit memory cell is less than a fixed value, the operation of the DRAM as a storage device becomes unstable, resulting in lowered reliability. To this end, attempts to further increase the surface area of the electrode of a capacitor have been considered.

A semiconductor memory device and a manufacturing method thereof disclosed by Japanese Patent Laying-Open No. 6-310672 will be described by way of illustration.

FIG. 13 is a cross sectional view showing a memory cell in a DRAM disclosed by the document. Referring to FIG. 13, a pair of $n^+$ type diffusion layers 112 and 113, the source/drain regions of an NMOS transistor are formed in a p type substrate 111. A field oxide film 119 is formed to electrically isolate the NMOS transistor from another MOS transistor. Formed between the pair of $n^+$ type diffusion layers 112 and 113 on p substrate 111 is a gate (word line) 115 buried with a polysilicon film via a gate oxide film.

A lower capacitor electrode is formed of polysilicon films 132 and 133, and polysilicon film 133 is electrically connected to $n^+$ type diffusion layer 112. A polysilicon film 118 to form an upper capacitor electrode is formed on polysilicon film 133 with a thin film 117 having a large dielectric constant interposed therebetween. An insulating film 121 is formed on the substrate including the capacitor. A bit line 122 electrically connected to $n^+$ type diffusion layer 113 is formed.

In the memory cell as described above, the outer peripheral portion A of polysilicon film 133 which corresponds to the lower electrode of the capacitor and a side surface of a recess D formed in the vicinity of the center of polysilicon film 133 may further increase the surface area of the capacitor electrode. Thus, the capacity to accumulate charge in the capacitor is secured, and the operation of the DRAM may be stabilized.

Now, the semiconductor memory device as described above and a manufacturing method thereof will be described in conjunction with the accompanying drawings.

Referring to FIG. 14, field oxide film 119, the pair of $n^+$ type diffusion layers 112 and 113, and word line 115 functioning as a gate electrode are formed on p type substrate 111. Then, an interlayer insulating film 114 of a silicon oxide film about as thick as 3000Å is formed by means of low pressure CVD. Referring to FIG. 15, a silicon nitride film 131 about as thick as 500Å is formed by means of low pressure CVD on interlayer insulating film 114. Referring to FIG. 16, a polysilicon film 132 about as thick as 6000Å is formed on silicon nitride film 131 by means of low pressure CVD. Anisotropic etching is then performed to form a central hole C to expose a surface of silicon nitride film 131.

Referring to FIG. 17, a silicon oxide film about as thick as 3000Å is formed on polysilicon film 132 including central hole C by means of atmospheric pressure CVD. The silicon oxide film is entirely etched back, and a side wall spacer 135 is formed only on the inner wall of central hole C.

Referring to FIG. 18, using side wall spacer 135 and polysilicon film 132 as a mask, a contact hole D is formed by a self-align contact process. Referring to FIG. 19, wet etching with hydrofluoric acid is performed to remove only the side wall spacer with silicon nitride film 131 remaining.

Referring to FIG. 20, polysilicon film 133 as thick as 500Å is formed on polysilicon film 132 by means of low pressure CVD. Then, polysilicon films 132 and 133 are subjected to anisotropic etching to form the lower electrode 116 of the capacitor in a prescribed shape.

Referring to FIG. 13, a silicon nitride film is formed on polysilicon film 133 by means of low pressure CVD. The silicon nitride film is oxidized to form thin film 117 having a large dielectric constant. Polysilicon film 118 to be the upper capacitor electrode is formed over thin film 117. An insulating film 121 is formed to cover polysilicon film 118. Bit line 122 is formed on insulating film 121. Bit line 122 is electrically connected to $n^+$ type diffusion layer 113. Through these steps, the memory cell in the DRAM is manufactured.

The document discloses that according to the method, contact hole 134 is provided by the self align contact process using as mask side wall spacer 135 and silicon nitride film 131 in the step shown in FIG. 18, and therefore contact hole 134 may be formed at an optimum position.

In recent semiconductor devices, however, even higher integration densities are in demand. To cope with the demand, forming a storage node to be the lower electrode of a capacitor thicker, thereby providing a capacitor with a storage node having an increased side surface area has been proposed. In the semiconductor device having such thick formed storage node (hereinafter referred to as "thick film storage node"), a contact hole with a high aspect ratio must be formed in order to electrically connect an interconnection formed on the thick film storage node and a semiconductor element such as transistor underlying the thick film storage node. More specifically, the ratio of the diameter of the contact hole relative to the depth should be large enough. Forming of such a contact hole is difficult. In order to electrically connect bit line 122 and $n^+$ type diffusion layer 113 shown in FIG. 13, for example, a deep contact hole should be provided.

In order to avoid this, bit line 122 is formed under the capacitor. Silicon oxide film 114 therefore should be further thicker to bury bit line 122. In this case, in the step shown in FIG. 18, the distance from the upper surface of polysilicon film 132 to the surface of $n^+$ type diffusion layer 112 is increased. If the contact diameter of contact hole 134 is 0.3 $\mu$m, to form an opening from the upper surface of polysilicon film 132 to the surface of $n^+$ type diffusion layer 112, the aspect ratio of the contact hole should be about 6 or more. Such a contact hole is very difficult to form.

The conventional method of manufacturing a semiconductor device is also encountered with the following problem. In the step shown in FIG. 19, during removing the side wall spacer of a silicon oxide film leaving underlying silicon nitride film 131 by means of wet etching, interlayer insulating film 114 of a silicon oxide film underlying silicon nitride film 131 is sometimes etched. More specifically, although formed according to different processes, the side wall spacer and interlayer insulating film 114 are both formed of a silicon oxide film, interlayer insulating film 114 may be etched simultaneously with the etching of the side wall spacer. In such a case, part of silicon nitride film 114 protrudes just as eaves on the side surface of contact hole. If polysilicon film 133 shown in FIG. 20 is formed in this state, the eaves keeps polysilicon film 133 from covering well the inner surface of contact hole 134, and polysilicon film 133 and $n^+$ type diffusion layer 112 sometimes cannot be electrically connected well.

The present invention is directed to a solution to such a problem, and it is one object of the invention to provide a semiconductor device with good electrical characteristic by achieving good electrical connection between the capacitor and transistor. Another object of the invention is to provide a method of manufacturing such a semiconductor device.

SUMMARY OF THE INVENTION

A semiconductor device in a first aspect of the invention includes a conductive layer, an insulating layer, a columnar conductive body portion, a lower electrode and an upper electrode. The conductive layer is formed on a main surface of a semiconductor substrate. The insulating film is formed on the main surface of the semiconductor substrate including the conductive layer. The columnar conductive body portion is formed of a conductive body filling a contact hole provided in the insulating film to expose a surface of the conductive layer so as not to exceed the upper end of contact hole. The lower electrode includes a first conductive body portion and a second conductive body portion. The upper electrode includes a third conductive body portion. The first conductive body portion is formed in a prescribed region on the insulating film including an upper part of the contact hole and has an opening portion to expose at least an upper end surface of the columnar conductive body portion. The second conductive body portion is formed in the opening portion, on the side surface of the opening, on the surface of the insulating film, on the upper end surface of the columnar conductive body portion, and on an upper surface of the first conductive body portion and electrically connects the columnar conductive body portion and the first conductive body portion. The third conductive body portion is formed on the surface of the lower electrode with a dielectric film interposed therebetween.

In this structure, the lower electrode including the first and second conductive body portions in which the first conductive body portion and is electrically connected to the columnar conductive body portion by the second conductive body portion and is electrically connected to the conductive layer through the columnar conductive body portion. The columnar conductive body portion connected to the conductive layer is formed within the contact hole in the insulating film. The second conductive body portion is formed to cover the opening portion provided in the first conductive body portion which exposes at least the upper end surface of the columnar conductive body portion. Therefore, the opening portion has a depth about as large as the thickness of the first conductive body portion, and may be readily formed. As a result, a semiconductor device with good electric connection between the lower electrode and the conductive layer may be readily provided, resulting in improvement in the electrical characteristic of the device.

Preferably, the semiconductor device further has a first conductivity type region, a pair of impurity regions of a second conductivity type, and a gate electrode. The first conductivity type region is formed in the main surface of the semiconductor substrate. The pair of impurity regions of the second conductivity type are formed a prescribed distance apart from each other in the first conductivity type region. The gate electrode is formed on the first conductivity type region between the pair of impurity regions with a gate insulating film therebetween. The conductive layer includes one of the pair of impurity regions.

The gate electrode and the pair of impurity regions are included to form a single transistor. A one-transistor-one-capacitor memory cell is thus formed.

More preferably, the opening portion is formed to isolate the first conductive body portion into two parts.

Therefore, if the design rule should be reduced to fabricate semiconductor devices with a higher density, the size of the lower electrode may be reduced while still maintaining the opening diameters of the opening portion and the contact hole. In other words if the size of the lower electrode is reduced, such that the opening diameter of the opening portion is relatively enlarged, and that the lower electrode is separated into two with the opening portion therebetween, good electrical connection may be achieved between the lower electrode and the conductive layer. As a result, a high density semiconductor device with good electrical characteristic may be provided.

Further preferably, the second conductive body portion has fine irregularities on the surface.

Therefore the surface area of the second conductive body portion further increases, and a larger amount of charges may be accumulated between the lower electrode and the upper electrode. As a result, electrical characteristics such as the memory retaining characteristics of the semiconductor device may be further improved.

A method of manufacturing a semiconductor device in a second aspect of the invention includes the following steps. A first conductive layer is formed on a main surface of a semiconductor substrate. An insulating film is formed on the main surface so as to cover the first conductive layer. A contact hole to expose a surface of the first conductive layer is formed in the insulating film. A second conductive layer is formed in a prescribed region on the insulating film including the inside of the contact hole. An opening portion is formed in the second conductive layer to expose a surface of the insulating film and to expose an upper end surface of the second conductive layer formed within the contact hole below the surface of the insulating film. A third conductive layer is formed on the side surface of the opening portion, the surface of the insulating film, the upper end surface of the second conductive layer and the upper surface of the second conductive layer. A fourth conductive layer is formed on the second and third conductive layers with a dielectric film therebetween.

In this structure, during forming the second conductive layer on the insulating film, the second conductive layer also fills in the contact hole. The third conductive layer covers the inside of the opening portion which exposes the upper end surface of the second conductive layer filling the contact hole provided in the second conductive layer on the insulating film. The depth of the opening needs only be virtually equal to the thickness of the second conductive layer on the insulating film. Therefore forming a relatively deep opening portion is not necessary, which alleviates the formation of the opening portion. The second conductive layer on the insulating film is electrically connected to the second conductive layer within the contact hole formed in the insulating film through the third conductive layer, and the second conductive layer within the contact hole is electrically connected to the first conductive layer. As a result, a semiconductor device with good electrical connection between the first conductive layer and the second and third conductive layers may be readily formed.

The step of forming the opening portion preferably includes a step of forming the second conductive layer to be separated into two.

Therefore, if a prescribed size of the second conductive layer is reduced in order to fabricate semiconductor devices with higher density, the opening portion may be formed without reducing its diameter and the diameter of the contact hole. More specifically, the diameter of the opening portion will be relatively larger than the prescribed size of the second conductive layer, and the second conductive layer is separated into two parts with the opening portion therebetween. The second conductive layer thus separated into two parts is electrically connected to the first conductive layer by the third conductive layer. Thus, the semiconductor device in need of higher density may be readily formed.

The manufacturing method more preferably includes the following steps. A first conductivity type region is formed on a main surface of a semiconductor substrate. A pair of impurity regions of a second conductivity type are formed a prescribed distance apart from each other in the first conductivity type region. A gate electrode is formed on the first conductivity type region between the pair of impurity regions with a gate insulating film therebetween. An insulating film is formed on the main surface to cover the gate electrode.

Thus, forming the gate electrode and the pair of impurity regions forms a single transistor. As a result, a memory cell including one transistor and one capacitor may be formed.

More preferably, the step of forming the third conductive layer includes a step of forming a polysilicon film having fine irregularities on the surface.

The surface area of the third conductive layer is thus increased, and a larger amount of charge may be accumulated between the third conductive layer and the fourth conductive layer. As a result, electrical characteristics such as the storage retaining characteristic of the semiconductor device may further be improved.

The step of forming the second conductive layer preferably includes a step of forming a polysilicon film doped with phosphorus. Thus the electrical resistance of the second conductive layer is lowered, thus improving the operation characteristic of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
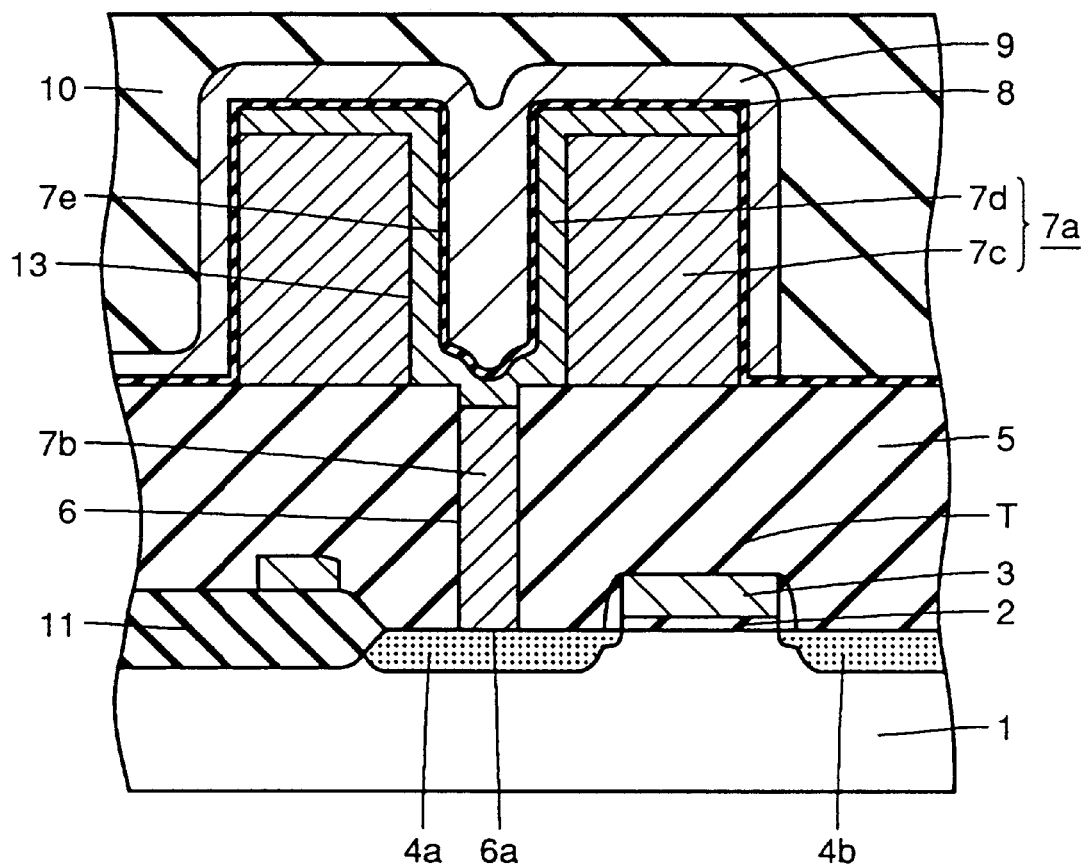
FIG. 1 is a cross sectional view showing a semiconductor device according to a first embodiment of the invention.

A semiconductor device according to a first embodiment of the invention will be described in conjunction with the accompanying drawings. FIG. 1 shows a cross section of the semiconductor device. Referring to FIG. 1, an MOS transistor T including a gate electrode 3 formed on a semiconductor substrate 1 with a gate insulating film 2 therebetween, and a pair of source/drain regions 4a and 4b. MOS transistor T is electrically insulated from another MOS transistor (not shown) by an isolation oxide film 11.

A silicon oxide film 5 is formed to cover MOS transistor T. A contact hole 6 to expose a surface of source/drain region 4a is formed in silicon oxide film 5. A polysilicon columnar conductive body 7b fills contact hole 6. Polysilicon columnar conductive body 7b and source/drain region 4a are electrically connected at a contact 6a.

Figure 9:
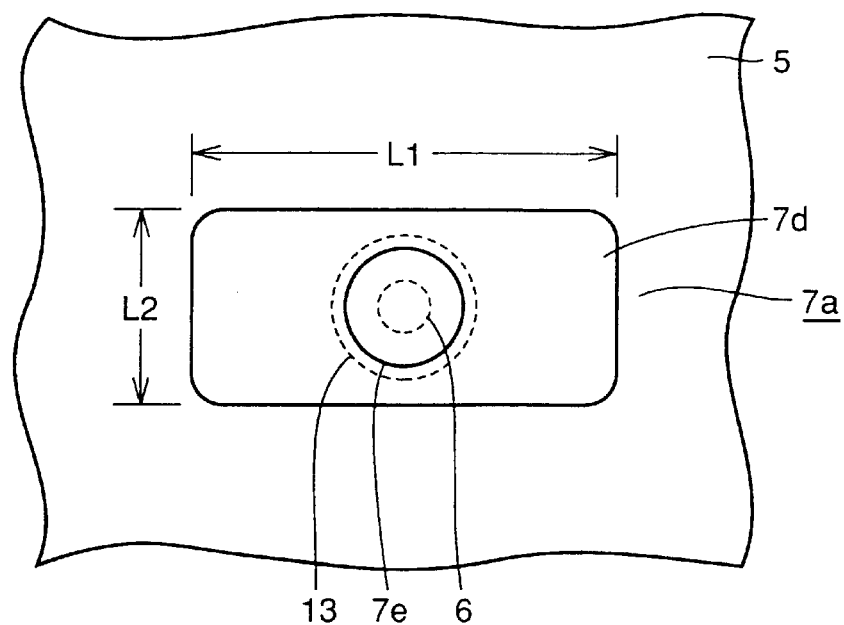
FIG. 9 is a plan view showing a semiconductor device in the step shown in FIG. 8 according to the embodiment.

A storage node 7a including a first polysilicon film 7c and a second polysilicon film 7d is formed on silicon oxide film 5. Storage node 7a forms a lower electrode of the capacitor. Storage node 7a is electrically connected to polysilicon columnar conductive body 7b through second polysilicon film 7d. As will be described later, the structure of storage node 7a viewed from the top is as shown in FIG. 9.

A cell plate 9 is formed on the surface of storage node 7a with a capacitor insulating film 8 therebetween. Cell plate 9 forms an upper electrode of the capacitor. An interlayer insulating film 10 is formed to cover cell plate 9.

In the semiconductor device as described above, a storage node recess 7e is provided from the upper surface of storage node 7a toward the vicinity of the surface of silicon oxide film 5. The surface area of the electrode of the capacitor is increased by the presence of the side surface of storage node recess 7e and a larger amount of charge accumulated in the capacitor may be secured. Note that use of a so-called rough surface polysilicon film having fine irregularities on its surface as second polysilicon film 7d further secures an even larger amount of charge accumulated in the capacitor.

In particular, if the storage node having such a structure is a thick film storage node, a bit line should be formed under the storage node as described above. In order to bury the bit line, the thickness of silicon oxide film 5 should be formed larger. In such a case, it has been difficult to form a contact hole for electrically connecting the storage node and the source/drain region according to conventional manufacturing methods as described above. The semiconductor device having the structure according to the invention can solve this disadvantage. Now, a description follows on manufacturing steps in the context.

Figure 2:
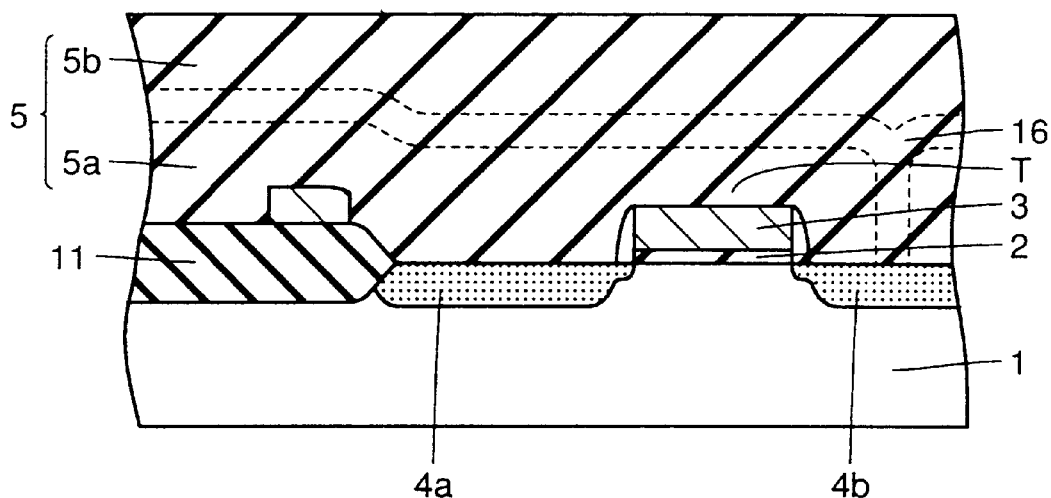
FIG. 2 is a cross sectional view showing one step in a method of manufacturing the semiconductor device according to the embodiment.

Referring to FIG. 2, an isolation oxide film 11 is formed on a p type semiconductor substrate 1 by means of LOCOS. A gate electrode 3 is formed through gate insulating film 2. Thereafter, using gate electrode 3 as mask, ions are implanted to form a pair of n type source/drain regions 4a and 4b, thus forming an MOS transistor T. Then, a silicon oxide film 5a is formed by means of CVD or the like cover MOS transistor T. A contact hole to expose a surface of source/drain region 4b is formed in silicon oxide film 5a. A polysilicon film is formed on silicon oxide film 5a to fill within the contact hole by means of CVD. The polysilicon film is etched by a prescribed photolithography technique to form a bit line 16. Bit line 16 is electrically connected to source/drain region 4b. Silicon oxide film 5b is formed on silicon oxide film 5a to cover bit line 16 by means of CVD. Note that in FIG. 2 bit line 16 is denoted by the dotted line, because it is buried by silicon oxide film 5. The bit line will be omitted in the views showing the following steps.

Figure 3:
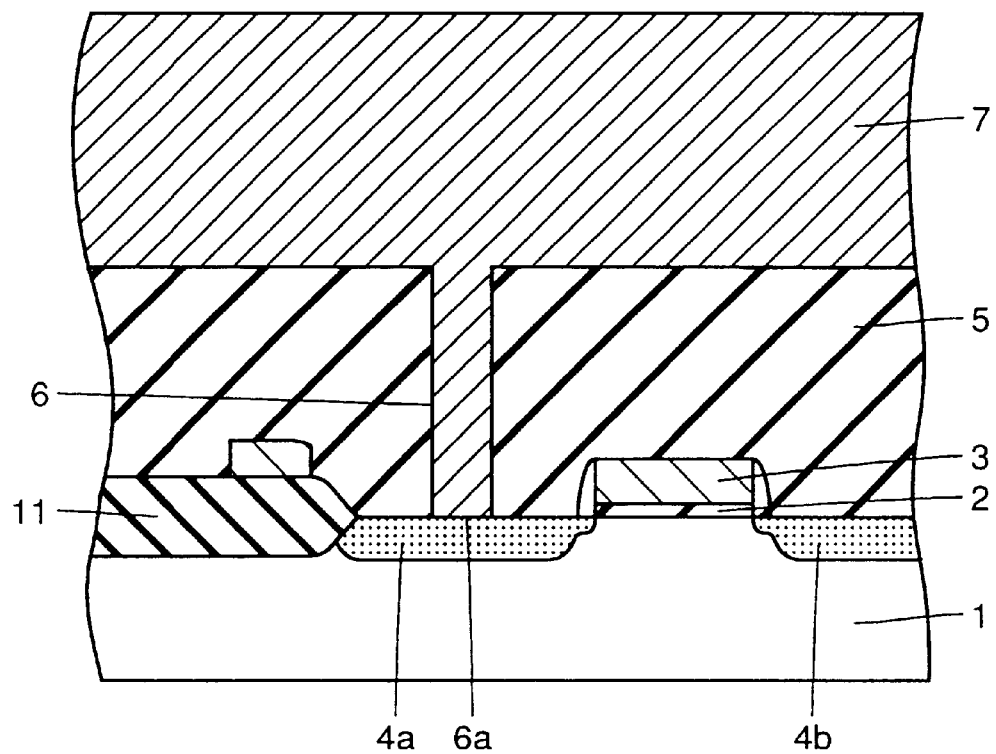
FIGS. 3 to 8 are cross sectional views sequentially showing steps following the step shown in FIG. 2 according to the embodiment.

Referring to FIG. 3, silicon oxide film 5 is subjected to prescribed photolithography. Silicon oxide film 5 is anisotropically etched to open a contact hole 6 to expose a surface of source/drain region 4a. The contact diameter of contact hole 6 is 0.3 μm. Polysilicon film 7 about as thick as 7000Å is formed to fill within contact hole 6 by means of CVD. Polysilicon film 7 is electrically connected to source/drain region 4a at contact 6a.

Figure 4:
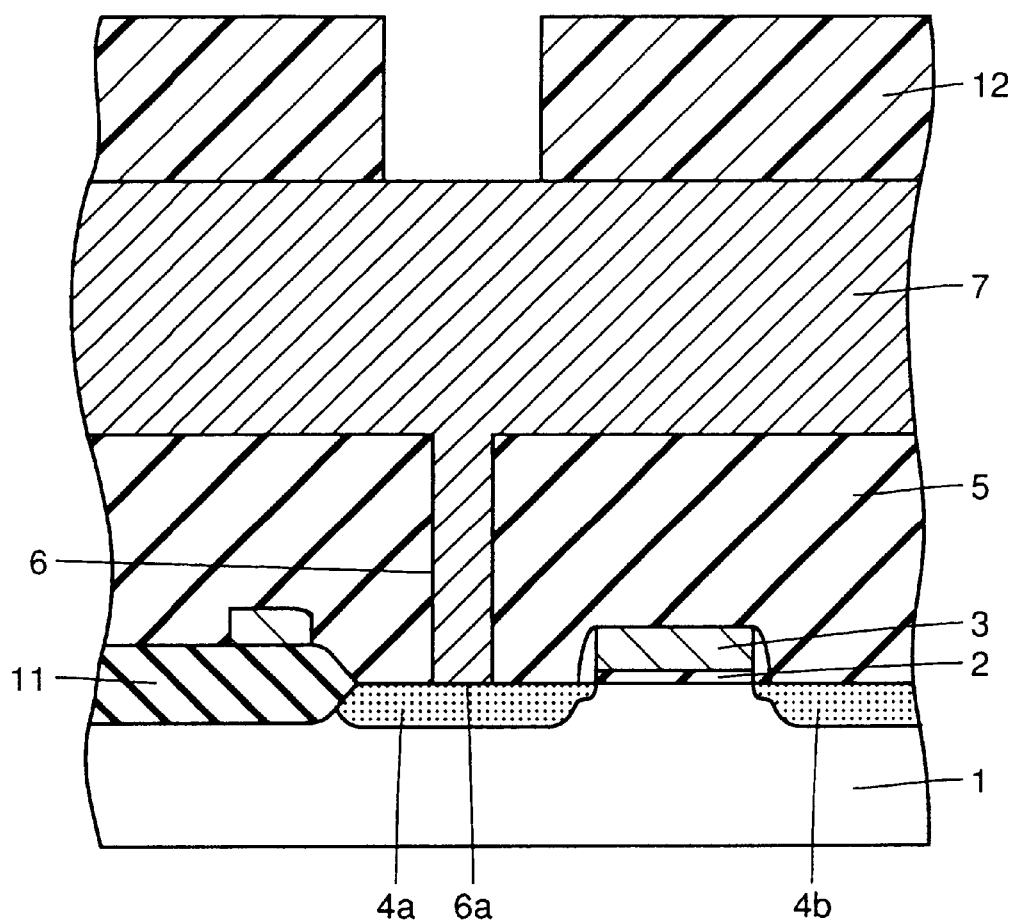

Referring to FIG. 4, polysilicon film 7 is subjected to prescribed photolithography, and photo resist 12 having an opening pattern is formed over contact hole 6. Assume that the diameter of opening is 0.5 μm and the diameter of opening of contact hole 6 is 0.3 μm or larger.

Figure 5:
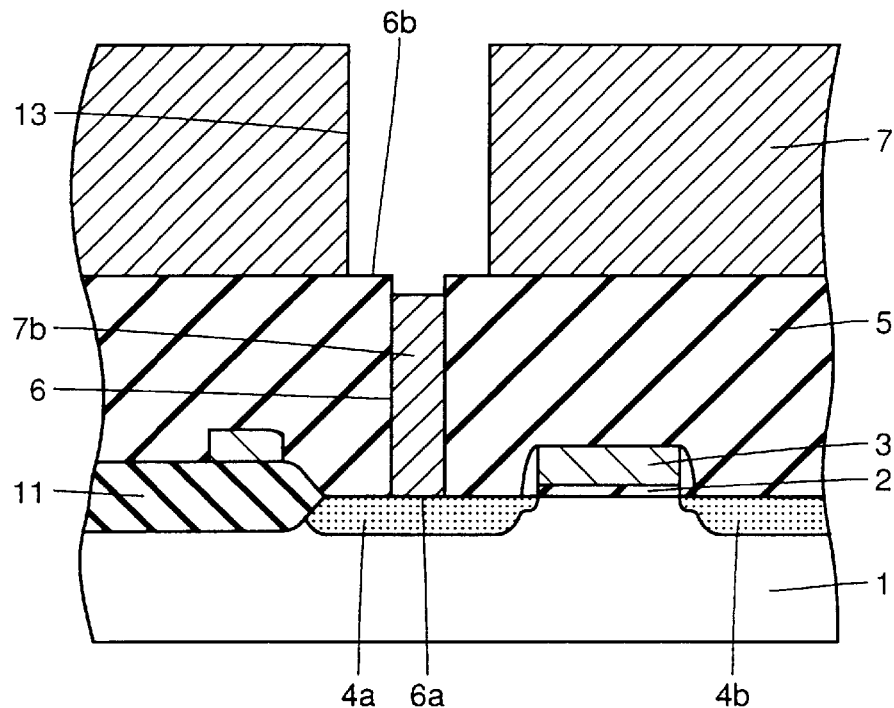

Referring to FIG. 5, using photo resist 12 shown in FIG. 4 as mask, polysilicon film 7 is anisotropically etched to form an opening portion 13. Opening portion 13 exposes an opening end 6b of contact hole 6, in other words a part of the surface of silicon oxide film 5. Under the surface of silicon oxide film 5, the upper end surface of polysilicon film filling contact hole 6 is exposed. The polysilicon film remaining in contact hole 6 forms a polysilicon columnar conductive body 7b.

In the conventional manufacturing method, the opening as deep as the thickness combining the thickness of polysilicon film 6 and the thickness of silicon oxide film 5 should be formed. In other words an opening portion having a large aspect ratio should be formed, and such opening was not easy to form. According to the manufacturing method of the invention, the depth of opening portion 13 is virtually equal to the thickness of polysilicon film 7. Therefore, opening portion 13 may be readily formed. Also in this step, polysilicon columnar conductive body 7b and polysilicon film 7 are temporarily electrically isolated from each other. Thereafter, photo resist is removed.

Figure 6:
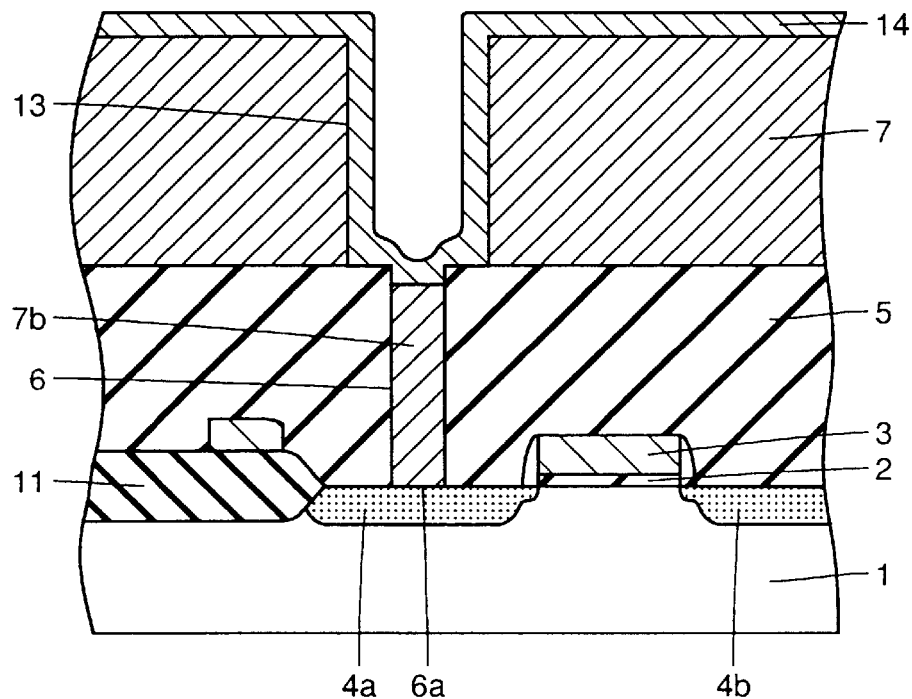
Figure 7:
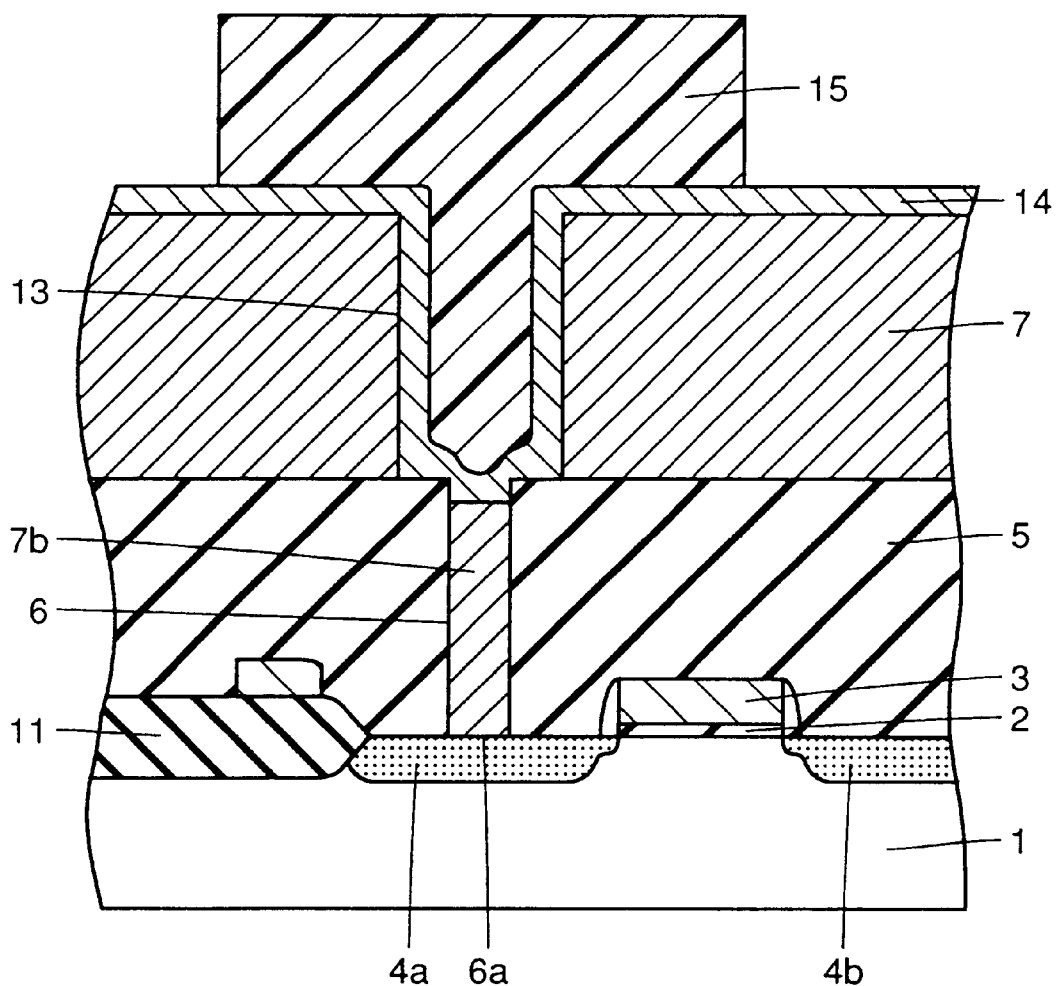
Figure 8:
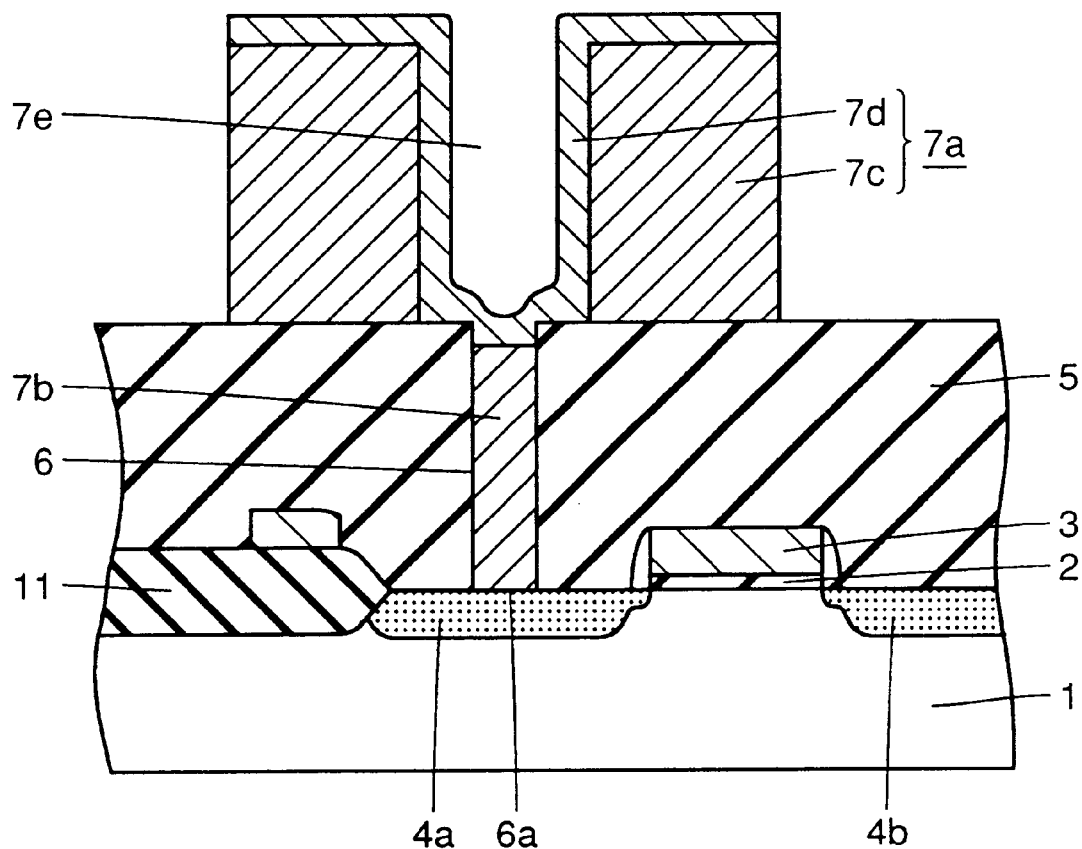

Referring to FIG. 6, a polysilicon film 14 as thick as about 500Å is further formed by means of CVD on polysilicon 7 including the inner surface of opening portion 13. Polysilicon 7 and polysilicon columnar conductive body 7b are once again electrically connected by the function of polysilicon film 14. Referring to FIG. 7, photo resist 15 having a prescribed pattern is formed to include opening portion 13. Referring to FIG. 8, using photo resist 15 shown in FIG. 7 as mask, polysilicon films 14 and 7 are anisotropically etched to expose a surface of silicon oxide film 5. The photo resist is then removed. Thus, a storage node 7a formed of first polysilicon film 7c and second polysilicon film 7d is formed. Storage node 7a is electrically connected to source/drain region 4a at contact 6a through polysilicon columnar conductive body 7b. A storage node recess 7e is formed in storage node 7a. A top view showing the step is given in FIG. 9. Referring to FIG. 9, the top form of storage node 7a forms an approximate rectangular shape with one side L1 having a length of 1.8 μm and another side L2 having a length of 0.7 μm. In the vicinity of the center, storage node recess 7e having a diameter of about 0.4 μm and a depth of about 0.65 μm is formed.

Then, referring to FIG. 1, a cell plate 9 is formed on storage node 7a with a capacitor insulating film 8 therebetween, which completes the capacitor. An interlayer insulating film 10 such as silicon oxide film is formed to cover cell plate 9, thus completing the semiconductor device.

According to the above-descried manufacturing method, particularly in the step shown in FIG. 5, an opening having a depth virtually equal to the thickness of polysilicon film 7 needs only be formed. Such an opening may be readily formed. In addition, polysilicon film 14 to electrically connect columnar conductive body 7b filling the contact hole and polysilicon film 7 may be formed well within opening portion 13. Furthermore, the surface area of the electrode of the storage node increases by the presence of polysilicon film 14 formed within opening portion 13. Thus, a semiconductor device having good electrical connection between the thick film storage node and source/drain region 4a may be readily provided, and a semiconductor device with good electrical characteristic may be provided.

Second Embodiment

Figure 10:
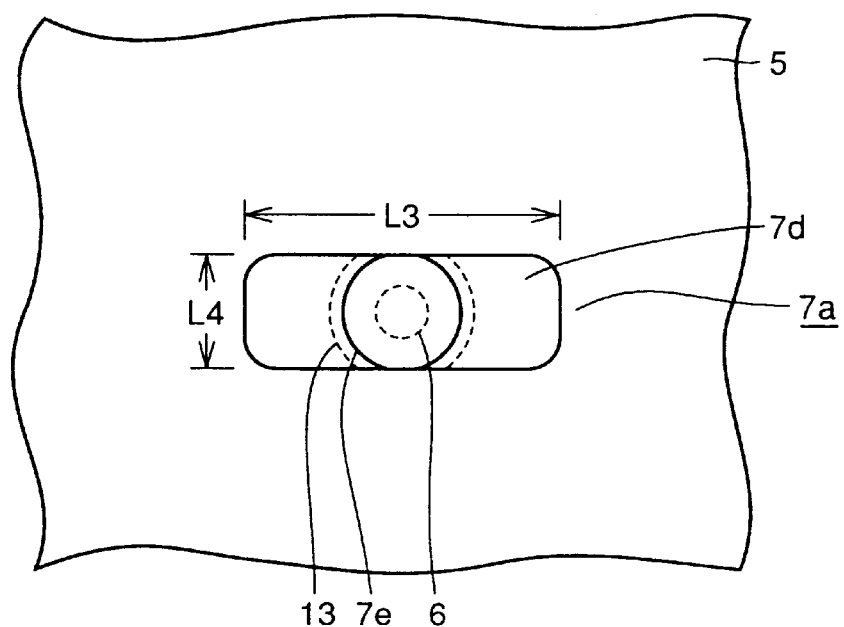
FIG. 10 is a plan view showing a semiconductor device in the step shown in FIG. 8 according to a second embodiment of the invention.
Figure 11:
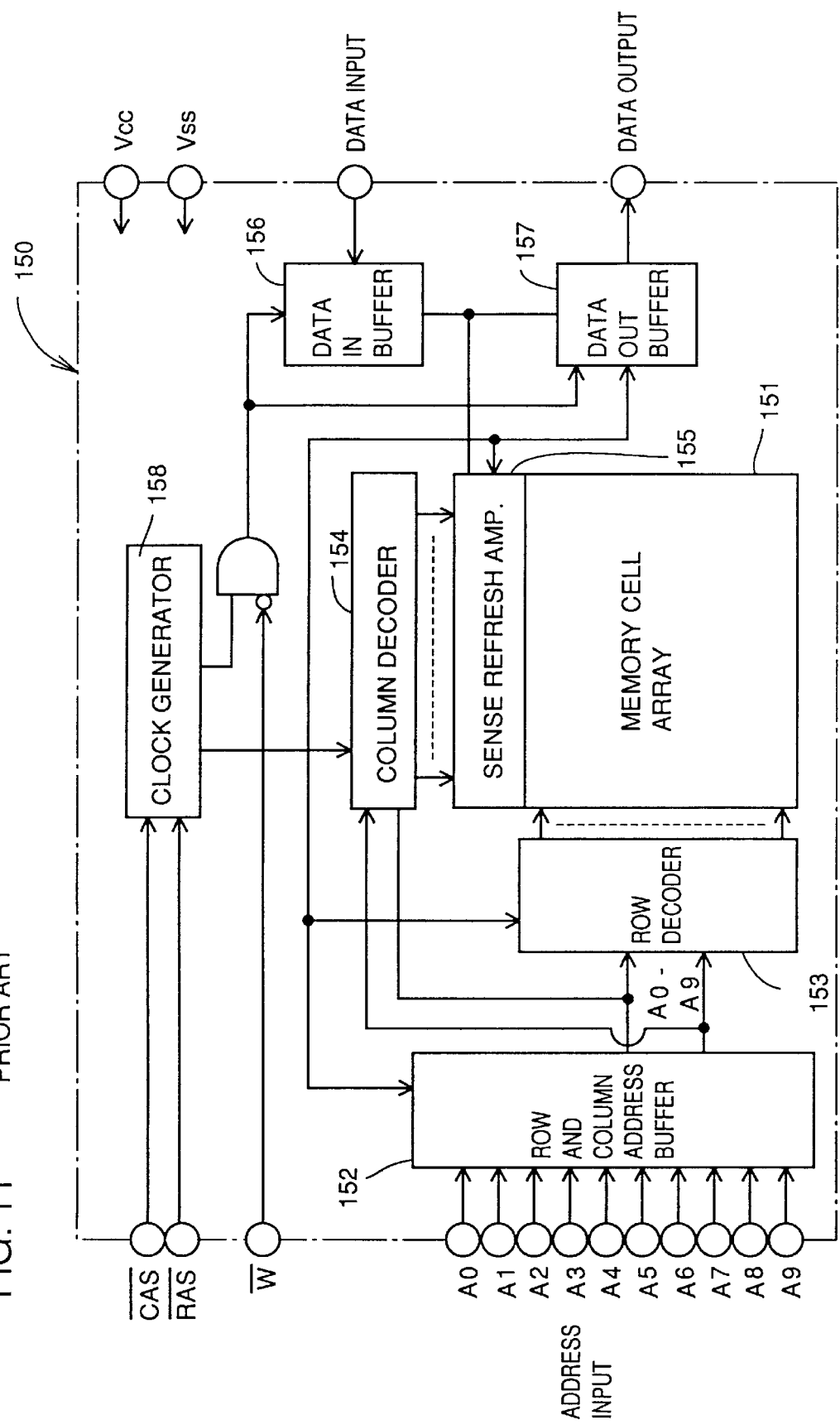
FIG. 11 is a block diagram showing a conventional DRAM.
Figure 12:
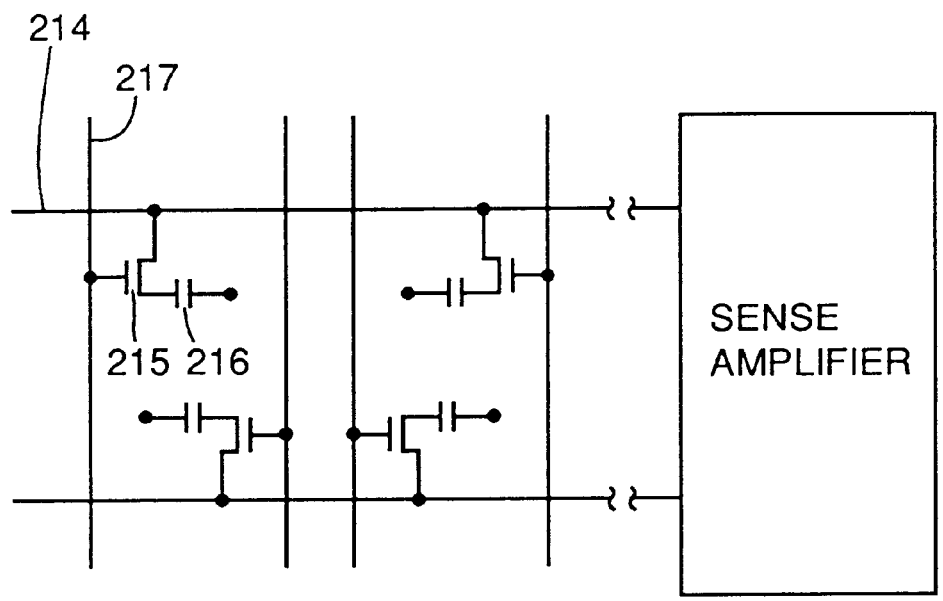
FIG. 12 is a diagram showing a circuit equivalent to a memory cell in the conventional DRAM.
Figure 13:
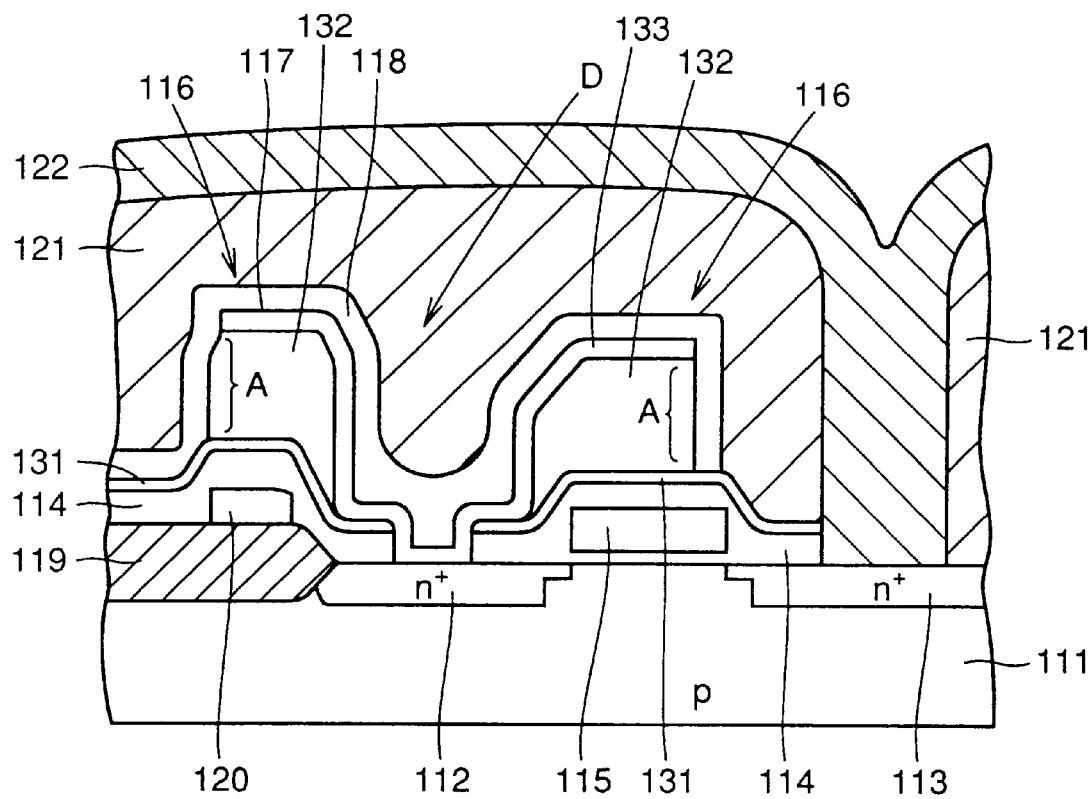
FIG. 13 is a view showing a cross section of the conventional DRAM.
Figure 14:
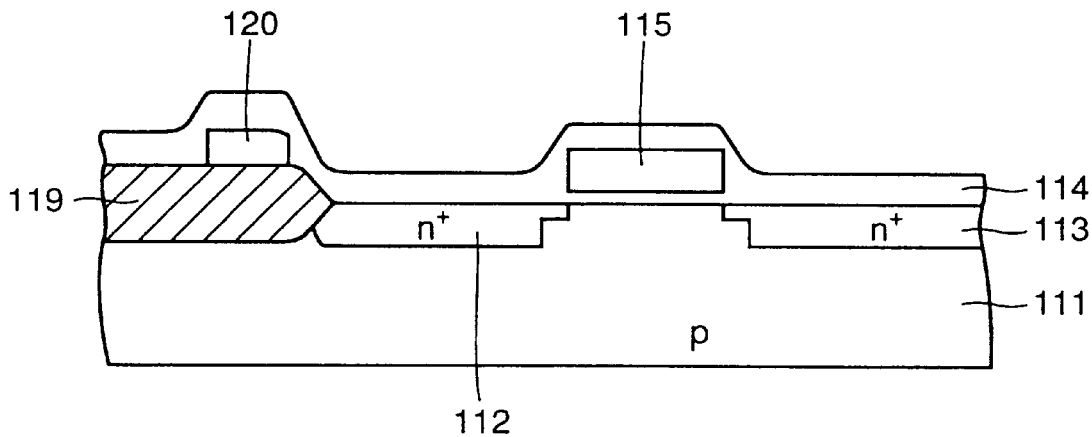
FIG. 14 is a cross sectional view showing one step in a method of manufacturing a conventional DRAM.
Figure 15:
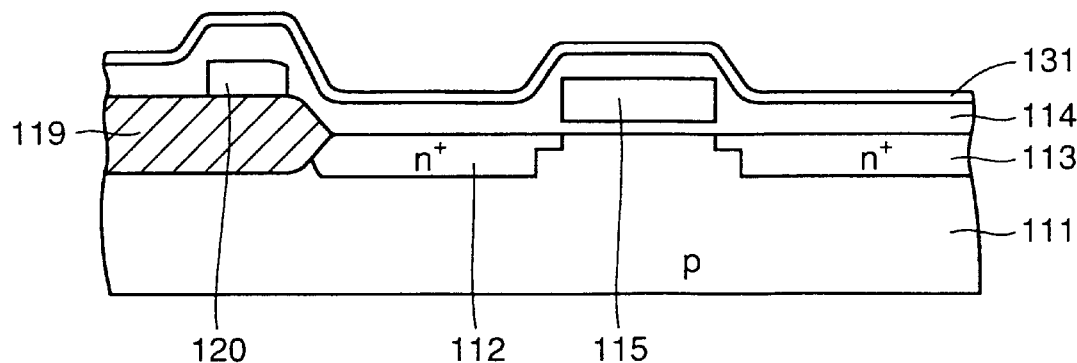
FIGS. 15 to 20 are cross sectional views showing sequentially steps following the step shown in FIG. 14.
Figure 16:
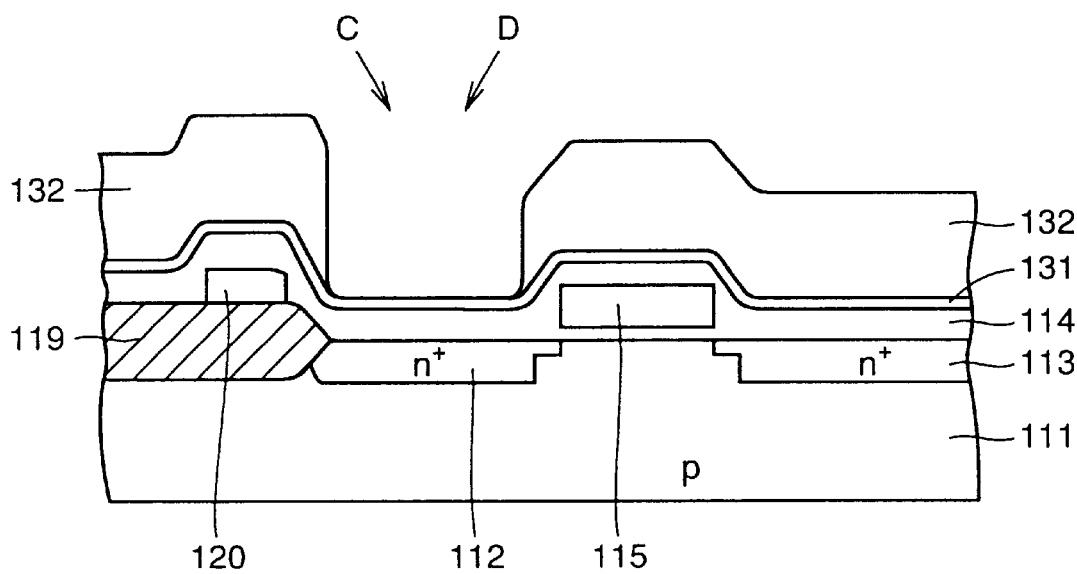
Figure 17:
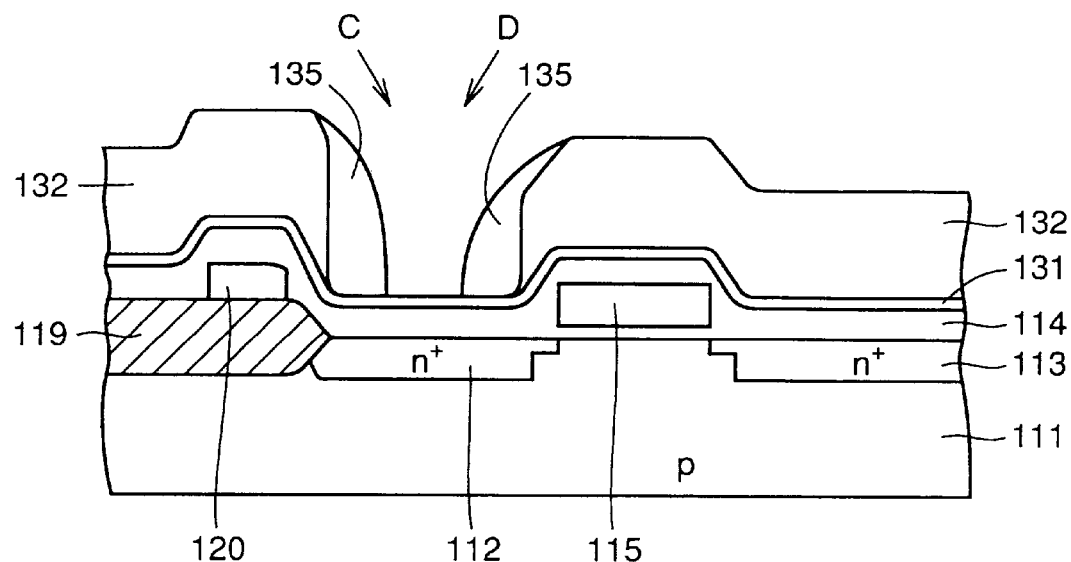
Figure 18:
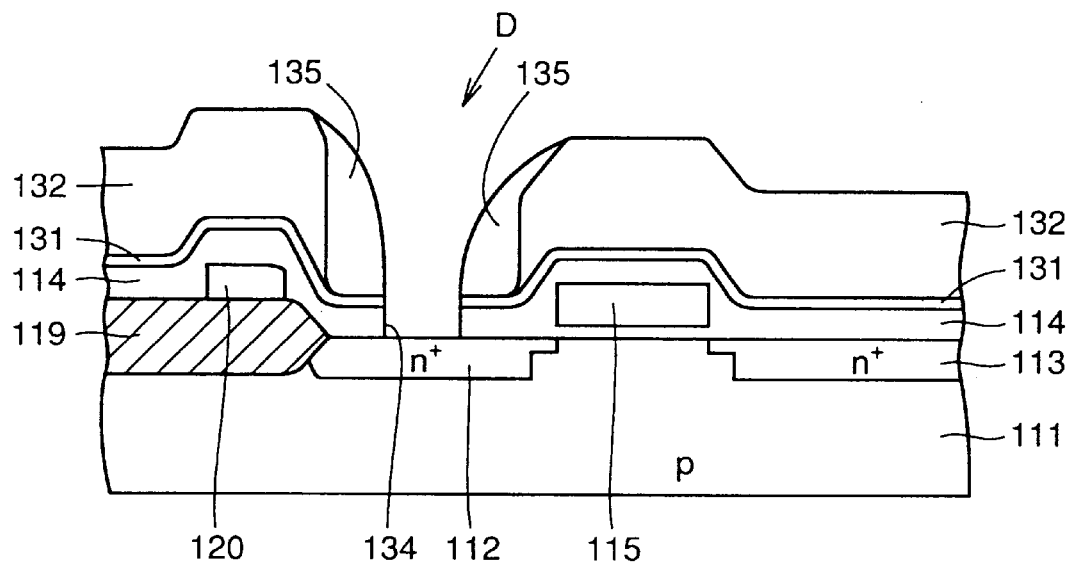
Figure 19:
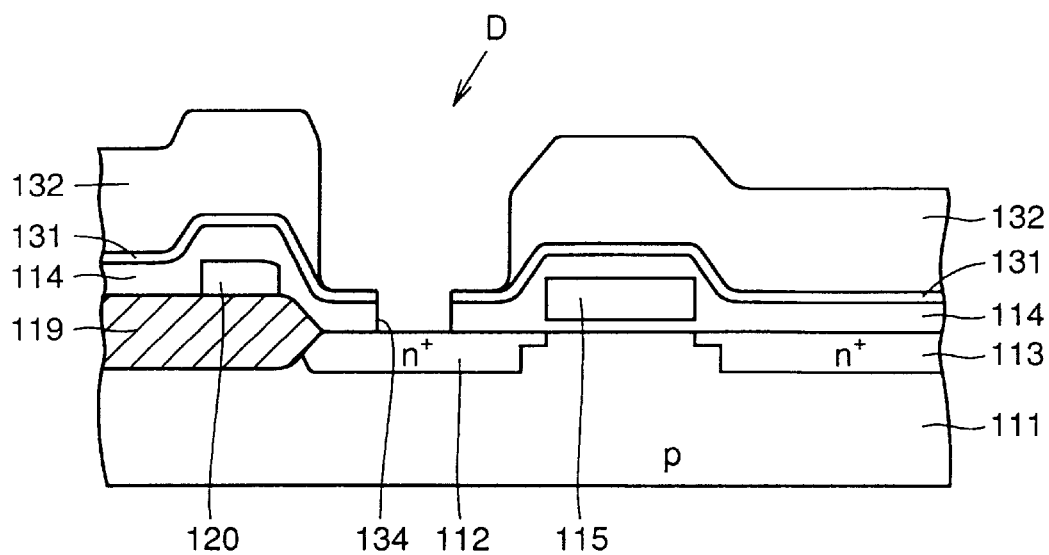
Figure 20:
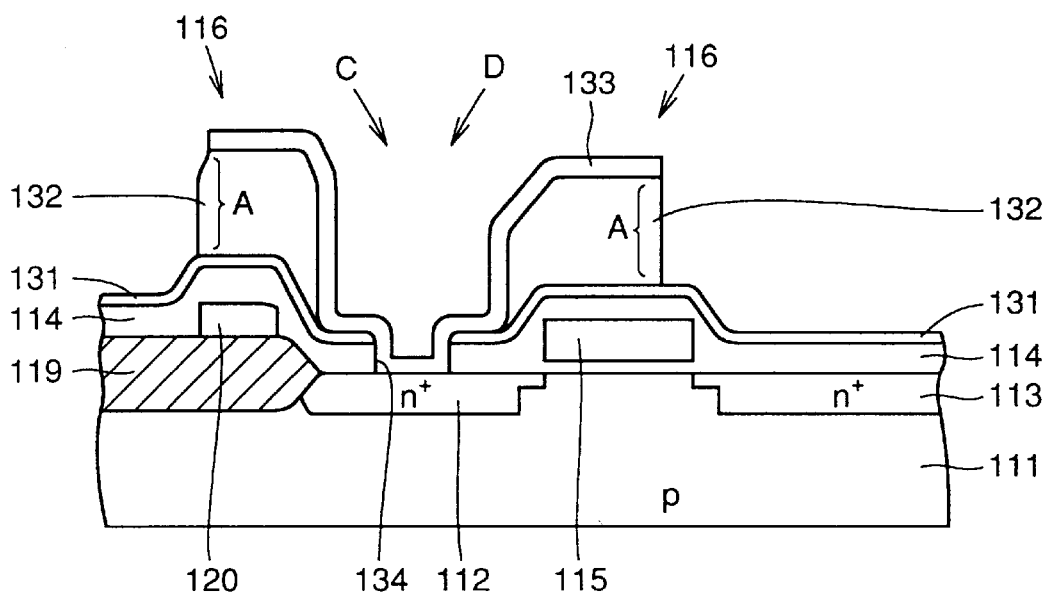

A semiconductor device having a reduced region to form a storage node will be described as an example of a semiconductor device to cope with higher density integration. A basic cross sectional structure of the device is substantially identical to that shown in FIG. 1, but the size of the storage node is shorter in this case. More specifically, referring to FIG. 10, storage node 7a forms an approximate rectangular form with one side L3 having a length of 1.5 $\mu$m and another side L4 having a length of 0.4 $\mu$m. The opening diameter of opening portion 13 formed in the steps shown in FIG. 5 is larger than the length of the other side L4 of storage node 7a formed in the step shown in FIG. 8. First polysilicon film 7c is temporarily electrically isolated into two parts with the opening portion therebetween immediately after forming opening portion 13.

Then, both parts of first polysilicon film and the polysilicon columnar conductive body are electrically connected by second polysilicon film 7d.

In the structure, if the region to form the storage node is reduced, the diameter of contact hole 6 or the diameter of opening portion does not have to be reduced.

More specifically, while keeping the size of opening, the size of the storage node may be reduced, and if the diameter of opening is relatively larger than the size of the storage node, electrical connection between the storage node and the source/drain region may be well achieved. Furthermore, a registration margin with a contact hole needed during photolithography of the storage node may be advantageously increased. Since the diameter of the contact hole does not have to be reduced, the contact resistance between the columnar conductive body and the source/drain region may be restrained from increasing.

As described in conjunction with the first embodiment, a so-called rough surface polysilicon film having irregularities on its surface may be applied as the second polysilicon film. In that case, the surface area of the storage node may further be increased. As an example of a method forming such a rough surface polysilicon film, a method disclosed in Japanese Patent Laying-Open No. 5-55505 may be applied.

In addition, a polysilicon film doped with phosphorus may be formed as the polysilicon columnar conductive body.

In that case, the electrical resistance of the polysilicon columnar conductive body may be reduced. As a result, the electrical characteristics of the device may further be improved.

Furthermore, while in the above preferred embodiments, the semiconductor substrate is of p type and source/drain regions are of n type, it goes without saying that the invention is similarly applicable to the case in which the types of conductivity are reversed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a conductive layer formed on a main surface of a semiconductor substrate;
    an insulating film formed on the main surface of said semiconductor substrate including said conductive layer, said insulating film formed with a contact hole extending from an upper surface of said insulating film to said conductive layer;
    a columnar conductive body portion formed in said contact hole and filling said contact hole up to a level lower than the upper surface of the insulating film;
    a lower electrode formed on the upper surface of said insulating film and said columnar conductive body portion, said lower electrode further comprising:
        a first conductive body portion formed on the upper surface of said insulating film;
        an opening portion formed in said first conductive body portion, extending from an upper surface of said conductive body portion to the upper surface of said insulating film and exposing an upper surface of said columnar conductive body portion, wherein said opening portion has a width greater than a width of said contact hole and exposes a portion of upper surface of said insulating film adjoining said contact hole; and
        a second conductive portion formed on the upper surface of said first conductive portion with an interface therebetween, the side surfaces of said opening portion, the exposed portion of the upper surface of said insulating film, and the upper surface of said columnar conductive body portion, for electrically connecting said columnar conductive body portion and said first conductive body portion; and
    an upper electrode including a third conductive body portion formed on a surface of said lower electrode with a dielectric film therebetween.

2. The semiconductor device as recited in claim 1, further comprising:
    a first conductivity type region formed on the main surface of said semiconductor substrate;
    a pair of impurity regions of a second conductivity type formed in said first conductivity type region at a prescribed distance from each other; and
    a gate electrode formed on said first conductivity type region between said pair of impurity regions with a gate insulating film therebetween, wherein
    said conductive layer includes one of said pair of impurity regions.

3. The semiconductor device as recited in claim 2, wherein
    said opening portion is formed to separate said first conductive body portion into two parts.

4. The semiconductor device as recited in claim 3, wherein
    said second conductive body portion has fine irregularities on its surface.

5. The semiconductor device as recited in claim 2, wherein
    said second conductive body portion has fine irregularities on its surface.

6. The semiconductor device as recited in claim 1, wherein
    said opening portion is formed to separate said first conductive body portion into two parts.

7. The semiconductor device as recited in claim 1, wherein
   said second conductive body portion has fine irregularities on its surface.

8. The semiconductor device as recited in claims 2, wherein said first conductive body portion has a substantially rectangular planar configuration, and said first conductive body portion is divided into two parts by the opening portion having a diameter greater than a length of a shorter side of said rectangular first conductive body portion.

9. The semiconductor device as recited in claim 1, wherein said opening portion is formed to divide said first conductive body portion into two parts.

* * * * *